(12) United States Patent
Aisenbrey

(10) Patent No.: US 7,102,077 B2
(45) Date of Patent: Sep. 5, 2006

(54) LOW COST ELECTROMAGNETIC ENERGY ABSORBING, SHRINKABLE TUBING MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

(*) Notice: Subject to any disclaimer, the term of this patent is extended or adjusted under 35 U.S.C. 154(b) by 0 days.

(21) Appl. No.: 10/929,301

(22) Filed: Aug. 30, 2004

(65) Prior Publication Data
US 2005/0029000 A1    Feb. 10, 2005

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/499,451, filed on Sep. 2, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*H01B 7/34* (2006.01)
(52) U.S. Cl. ........................................... 174/36
(58) Field of Classification Search .................. 174/36, 174/110 R, 120 C, DIG. 8; 428/34.9, 35.1–3, 428/36.4, 58, 192, 200, 347, 349; 138/150, 138/170, 128, 174
See application file for complete search history.

(56) References Cited

U.S. PATENT DOCUMENTS 3,576,387 A * 4/1971 Derby .......................... 174/36
4,207,364 A * 6/1980 Nyberg ....................... 138/141

(Continued)

*Primary Examiner*—William H. Mayo, III
(74) *Attorney, Agent, or Firm*—Douglas Schnabel

(57) ABSTRACT

Electromagnetic energy absorbing, shrinkable tubing are formed of a conductive loaded resin-based material. The conductive loaded resin-based material has micron conductive powder(s), conductive fiber(s), or a combination of conductive powder and conductive fibers in a base resin host. The percentage by weight of the conductive powder(s), conductive fiber(s), or a combination thereof is between about 20% and 50% of the weight of the conductive loaded resin-based material. The micron conductive powders are formed from non-metals, such as carbon, graphite, that may also be metallic plated, or from metals such as stainless steel, nickel, copper, silver, that may also be metallic plated, or from a combination of non-metal, plated, or in combination with, metal powders. The micron conductor fibers preferably are of nickel plated carbon fiber, stainless steel fiber, copper fiber, or silver fiber.

56 Claims, 9 Drawing Sheets

U.S. PATENT DOCUMENTS

| | | | |
|---|---|---|---|
| 4,500,595 A * | 2/1985 | Gerteisen et al. | 428/298.7 |
| 4,555,422 A | 11/1985 | Nakamura et al. | 428/36 |
| 4,559,973 A * | 12/1985 | Hane et al. | 138/138 |
| 4,576,993 A * | 3/1986 | Tamplin et al. | 525/240 |
| 4,598,165 A * | 7/1986 | Tsai | 174/36 |
| 4,610,808 A * | 9/1986 | Kleiner | 252/512 |
| 4,634,615 A * | 1/1987 | Versteegh et al. | 138/141 |
| 4,678,699 A * | 7/1987 | Kritchevsky et al. | 428/175 |
| 4,680,093 A * | 7/1987 | Morin | 428/626 |
| 4,735,833 A * | 4/1988 | Chiotis et al. | 428/34.5 |
| 4,803,103 A * | 2/1989 | Pithouse et al. | 428/34.5 |
| 5,098,753 A * | 3/1992 | Gregory et al. | 428/34.9 |
| 5,106,437 A * | 4/1992 | Lau et al. | 156/51 |
| 5,110,638 A * | 5/1992 | Vogdes et al. | 428/35.1 |
| 5,302,428 A * | 4/1994 | Steele et al. | 428/34.9 |
| 5,470,622 A * | 11/1995 | Rinde et al. | 428/34.9 |
| 5,972,139 A | 10/1999 | Chu | 156/84 |
| 6,005,191 A | 12/1999 | Tzeng et al. | 174/102 R |
| 6,064,000 A | 5/2000 | Kim | 174/36 |
| 6,225,565 B1 * | 5/2001 | Prysner | 174/120 SC |
| 6,350,493 B1 * | 2/2002 | Podlaseck et al. | 427/96.3 |
| 6,410,848 B1 | 6/2002 | Shrader et al. | 174/36 |
| 2002/0037376 A1 * | 3/2002 | Fenton | 428/34.9 |
| 2003/0186602 A1 | 10/2003 | Millas et al. | 442/78 |

* cited by examiner

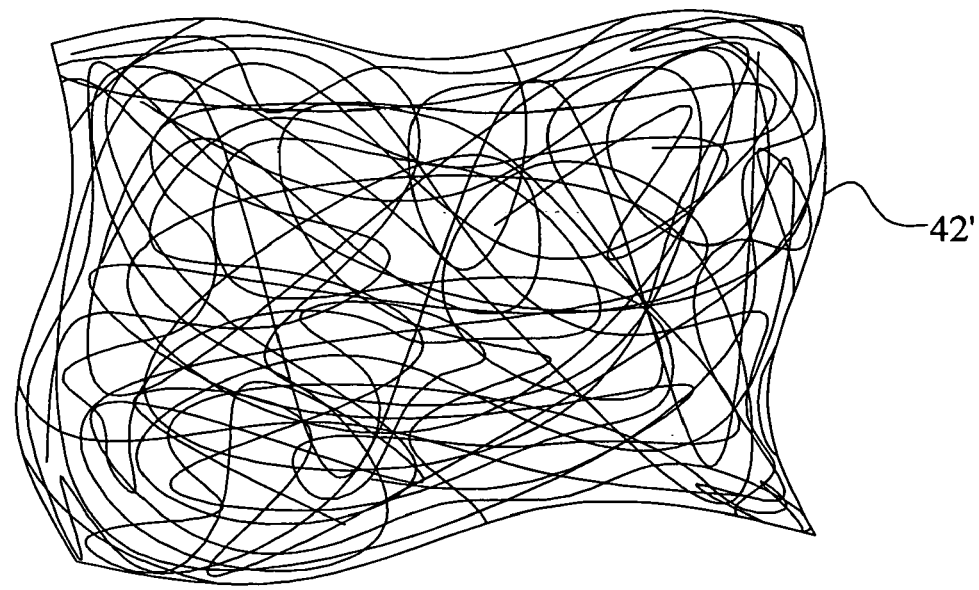
FIG. 5b
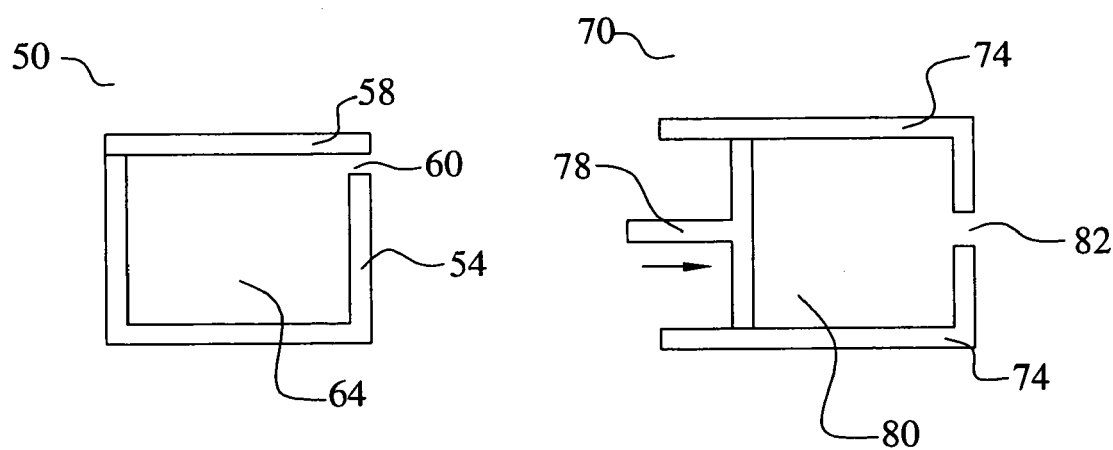
FIG. 6a
FIG. 6b

LOW COST ELECTROMAGNETIC ENERGY ABSORBING, SHRINKABLE TUBING MANUFACTURED FROM CONDUCTIVE LOADED RESIN-BASED MATERIALS

This Patent Application claims priority to the U.S. Provisional Patent Application 60/499,451, filed on Sep. 2, 2003, which is herein incorporated by reference in its entirety.

This Patent Application is a Continuation-in-Part of INT01-002CIP, filed as U.S. patent application Ser. No. 10/309,429, filed on Dec. 4, 2002, now issued as U.S. Pat. No. 6,870,516, also incorporated by reference in its entirety, which is a Continuation-in-Part application of docket number INT01-002, filed as U.S. patent application Ser. No. 10/075,778, filed on Feb. 14, 2002, now issued as U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to shrinkable tubing and, more particularly, to electromagnetic energy absorbing, shrinkable tubing molded of conductive loaded resin-based materials comprising micron conductive powders, micron conductive fibers, or a combination thereof, homogenized within a base resin when molded. This manufacturing process yields a conductive part or material usable within the EMF or electronic spectrum(s).

(2) Description of the Prior Art

Shrinkable tubing is used in the art to protect electrical wiring and/or connectors from electrical shorting as well as to protect from external factors such as moisture, contaminates, and corrosives. Heat shrink tubing is typically a polymer-based material, such as polyolefin, formed by a process of molding the material, irradiating the material to create polymer chain cross-linking, and then stretching the material at a moderate heat such that the material is plastic but not melted. In application, the shrinkable tubing is loosely placed over the wiring or connector and is then heated. This heat treatment energizes the cross-linked polymer bonds and causes the tubing to 'recover' to its pre-stretched dimensions. As a result, a tight tube covering is formed over the wiring, connector, or other object.

In addition to environmental protection, another consideration in electronics/electrical systems is electromagnetic interference (EMI). All electronics/electrical systems generate electromagnetic energy due to the movement of electrical charge within the circuit. This electromagnetic energy can be a useful feature, as in the transmission or reception of electromagnetic waves in radio communications. Conversely, electromagnetic energy emanating from a first source can adversely impact the performance of a second source. For example, high energy switching in an automotive ignition system can generate substantial electromagnetic energy emissions that can enter an automotive radio system and result in bad performance. In this case, the ignition emission is considered an electromagnetic interference (EMI) or radio frequency interference (RFI) onto the radio system.

Typically in the art of electrical/electronics systems, attempts are made to shield signal carrying wiring and/or connectors from EMI/RFI through the application of metal shielding structures. For example, a metal mesh sleeve is typically placed around a sensitive signal cable. This sleeve is then connected to ground. Where environmental protection is further desired, shrinkable tubing is additionally placed around the metal mesh sleeve and then heat recovered to complete the shielding and protection application. It is a primary objective of the present invention to provide an improved shrinkable material capable both of environmental protection and of enhanced EMI protection.

Several prior art inventions relate to shrinkable tubing and/or to electromagnetic shielding structures. U.S. Patent Publication US 2002/0037376 A1 to Fenton teaches a heat shrinkable article for shielding against EMI and RFI. U.S. Patent Publication US 2003/0186602 A1 to Millas et al teaches a heat-shrinkable EMI/RF shielding material that utilizes a heat-shrinkable woven fabric coated in a conductive slurry. This invention also teaches constructing the heat-shrinkable woven fabric construction of a mixture of polyolefin and polyester. U.S. Pat. No. 6,005,191 to Tzeng et al teaches a heat-shrinkable jacket for EMI shielding comprising an inner layer of electrically-conductive mesh or fabric covered by an outer layer of a heat-shrinkable polymeric material selected from a group consisting of rubbers, polyolefins, polyamides, polycarbonates, polyesters, and the like.

U.S. Pat. No. 6,064,000 to Kim teaches a heat-shrinkable shielding tube that utilizes an inner layer of metallized fabric that overlaps itself so that the inner longitudinal edge is in direct contact with the outer longitudinal edge and, further, wrapped in an outer layer of a heat shrinkable material. U.S. Pat. No. 5,972,139 to Chu teaches a thermally shrinkable and electromagnetic wave proof tube that utilizes a sleeve of woven soft zinc coated copper wires where the sleeve is placed inside or outside a thermally shrinkable plastic tube. U.S. Pat. No. 4,555,422 to Nakamura et al teaches a heat-shrinkable magnetic shielding article comprising an inner layer of a polymeric material containing a powdery ferrite and an outer layer of a heat shrinkable thermoplastic polymeric material. This invention teaches 10% to 90% ferrite based on the total weight of the inner layer. U.S. Pat. No. 6,410,848 B1 to Shrader et al teaches a side entry heat shrinkable cable jacket that utilizes a conductive fabric inner layer if EMI shielding is desired.

SUMMARY OF THE INVENTION

A principal object of the present invention is to provide an effective electromagnetic energy absorbing, shrinkable tubing.

A further object of the present invention is to provide a method to form an electromagnetic energy absorbing, shrinkable tubing.

A further object of the present invention is to provide an electromagnetic energy absorbing, shrinkable tubing molded of conductive loaded resin-based materials.

A yet further object of the present invention is to provide methods to fabricate an electromagnetic energy absorbing, shrinkable tubing from a conductive loaded resin-based material incorporating various forms of the material.

A yet further object of the present invention is to provide a method to fabricate an electromagnetic energy absorbing, shrinkable tubing from a conductive loaded resin-based material where the material is in the form of a fabric.

A yet further object of the present invention is to provide an electromagnetic energy absorbing, shrinkable tubing comprising a homogeneous material that can be applied as a single sleeve.

A yet further object of the present invention is to provide an electromagnetic energy absorbing, shrinkable tubing that is lower in weight than prior art metal mesh sleeving and shrink tubing solutions.

A yet further object of the present invention is to provide an electromagnetic energy absorbing, shrinkable tubing compatible with a variety of base resins and of conductive loading materials.

A yet further object of the present invention is to provide an electromagnetic energy absorbing, shrinkable tubing wherein the conductive loaded resin-based material is shrinkable.

A yet further object of the present invention is to provide an electromagnetic energy absorbing, shrinkable tubing wherein the conductive loaded resin-based material is flowable.

A yet further object of the present invention is to provide an electromagnetic energy absorbing, shrinkable tubing capable of formation in a variety of shapes, including sheeting.

In accordance with the objects of this invention, a shrinkable electromagnetic energy absorbing device is achieved. The device comprises a hollow sleeve of a conductive loaded, resin-based material comprising conductive materials in a base resin host. The hollow sleeve shrinks when exposed to heat.

Also in accordance with the objects of this invention, a shrinkable electromagnetic energy absorbing device is achieved. The device comprises a hollow sleeve of a conductive loaded, resin-based material comprising conductive materials in a base resin host. The hollow sleeve shrinks when exposed to heat. The percent by weight of the conductive materials is between about 20% and about 50% of the total weight of the conductive loaded resin-based material.

Also in accordance with the objects of this invention, a method to form a shrinkable electromagnetic energy absorbing device is achieved. The method comprises providing a conductive loaded, resin-based material comprising conductive materials in a resin-based host. The conductive loaded, resin-based material is molded into a shrinkable electromagnetic energy absorbing device.

BRIEF DESCRIPTION OF THE DRAWINGS

In the accompanying drawings forming a material part of this description, there is shown:

FIGS. 5a and 5b illustrate a fourth preferred embodiment wherein conductive fabric-like materials are formed from the conductive loaded resin-based material.

FIGS. 6a and 6b illustrate, in simplified schematic form, an injection molding apparatus and an extrusion molding apparatus that may be used to mold electromagnetic energy absorbing shrinkable tubing of a conductive loaded resin-based material.

DESCRIPTION OF THE PREFERRED EMBODIMENTS

Figure 1A:
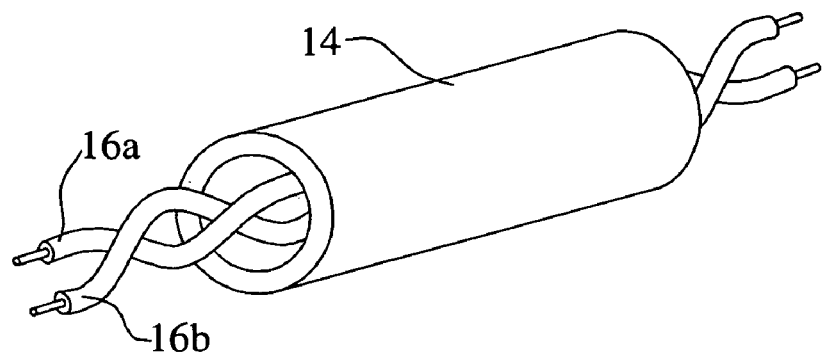
FIGS. 1a and 1b illustrate a first preferred embodiment of the present invention showing an electromagnetic energy absorbing shrinkable tubing comprising a conductive loaded resin-based material.

This invention relates to electromagnetic energy absorbing, shrinkable tubing molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of electromagnetic energy absorbing, shrinkable tubing fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the shrinkable tubing devices are homogenized together using molding techniques and or methods such as injection molding, over-molding, insert molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of electromagnetic energy absorbing, shrinkable tubing significantly lowers the cost of materials and the design and manufacturing processes used to hold ease of close tolerances, by forming these materials into desired shapes and sizes. The electromagnetic energy absorbing, shrinkable tubing can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the electromagnetic energy absorbing, shrinkable tubing. The doping composition and directionality associated with the micron conductors within the loaded base resins can affect the electrical and structural characteristics of the shrinkable tubing and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming electromagnetic energy absorbing, shrinkable tubing that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in electromagnetic energy absorbing, shrinkable tubing applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductor loaded resin-based material exhibits excellent thermal dissipation characteristics. Therefore, electromagnetic energy absorbing, shrinkable tubing manufactured from the molded conductor loaded resin-based material can provide added thermal dissipation capabilities to the application. For example, heat can be dissipated from electrical devices physically and/or electrically connected to electromagnetic energy absorbing, shrinkable tubing of the present invention.

As a significant advantage of the present invention, electromagnetic energy absorbing, shrinkable tubing constructed of the conductive loaded resin-based material can be easily interfaced to an electrical circuit or grounded. In one embodiment, a grounding wire is placed adjacent to the protected signal wires prior to sleeving both the signals wires and the grounding wire with the conductive loaded resin-based electromagnetic energy absorbing, shrinkable tubing. After shrinking the electromagnetic energy absorbing, shrinkable sleeve, the grounding wire is then attached to ground.

Figure 1B:
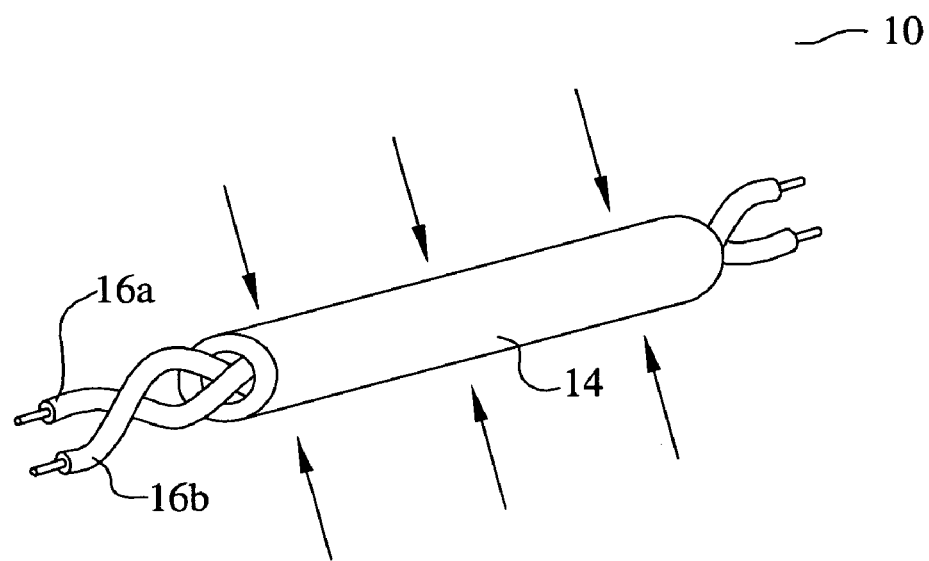

Referring now to FIGS. 1a and 1b, a first preferred embodiment 10 of the present invention is illustrated. Several important features of the present invention are shown and discussed below. Referring now to FIG. 1a, a shrinkable tubing, or sleeve, 14 of the conductive loaded resin-based material is shown. The tubing 14 is placed around an object requiring protection, in this case a twisted pair of wires 16a and 16b. The conductive loaded resin-based shrinkable tubing 14 comprises a base resin material that is capable of polymer cross-linking, is capable of plastic stretching or shaping at a temperature below the melting temperature of the resin, and is capable of recovering from mechanical stretching at a temperature below the melting temperature of the resin.

A number of resins are known to possess cross-linking and stretch-recovery capabilities as described above. For example, polyolefins, such as polyethylene, polypropylene, polystyrene, and the like; rubbers, such as neoprene, silicone, and the like; vinyls, such as polyvinyl chloride, polyvinyl acetate, and the like; polyamides; fluoropolymers, such as polytetrfluoroethylene and the like; polyesters, such as polyethylene terephthalate and the like; and copolymers and blends thereof. These resin-based materials exhibit plastic memory. When the material is cross-linked, oriented, or otherwise residually stressed into an expanded shape, it is sufficiently elastic to contract, shrink, or recover to its pre-expanded shape when the material is raised to a temperature sufficient to allow release of the residual stress. Any such resin-based material exhibiting this property may be used as the base resin for the conductive loaded resin-based material of the present invention.

While the base resin material provides the stretch-recovery capability necessary for shrinkable sleeving 14 or tubing, it is the novel combination of the conductive loading with the base resin which provides the unique and previously unexpected features of the present invention. The conductive load is homogeneously mixed throughout the base resin and forms a conductive network of fiber and/or powder in the polymer matrix of the base resin. The conductive network interacts with the bonds of the polymer matrix to form a unique material having a well-controlled, low resistivity and an excellent dielectric response. As a result, the conductive loaded resin-based sleeve or tubing 14 of the present invention exhibits excellent capabilities for absorbing electromagnetic energy across a wide frequency range and of conducting this energy away from the protected signals 16a and 16b. The conductive loaded resin-based material sleeve 14 provides excellent absorption of externally sourced EMI/RFI energy. Further, the conductive loaded resin-based material sleeve 14 provides excellent absorption of internally generated EMI/RFI energy. In either case, this energy is absorbed into the sleeve rather than being reflected inward or outward as is the case in prior art metal sleeves.

Figure 11:
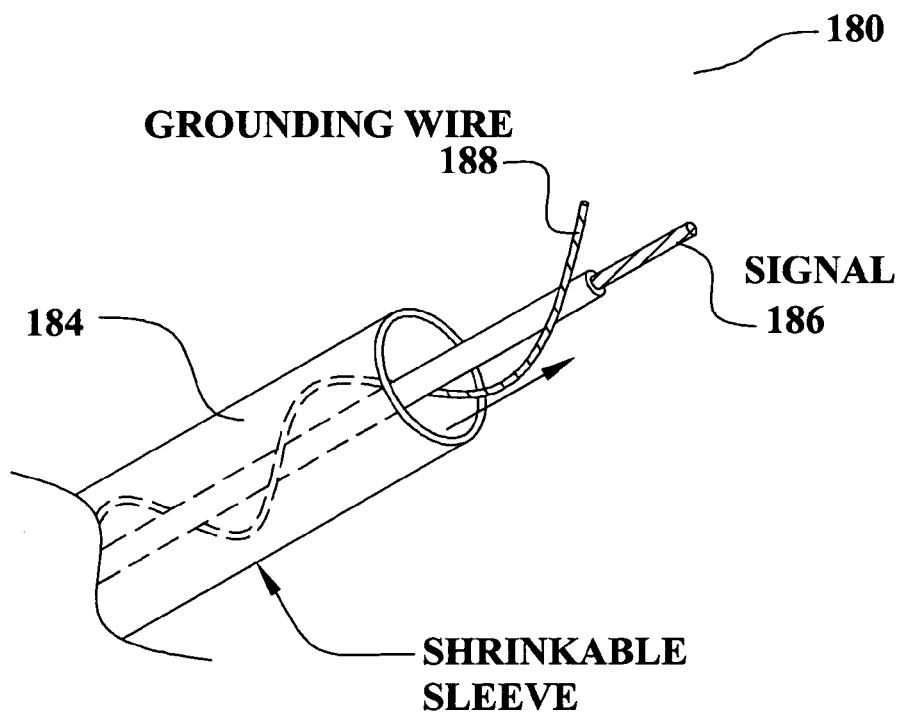
FIG. 11 illustrates a fifth preferred embodiment of the present invention wherein a grounding wire is wrapped around the protected signal wiring prior to placement of the shrinkable tubing of the present invention.

The conductive loaded resin-based material 14 may be further coupled to a grounding circuit to provide a path to shunt the electromagnetic energy. Referring now to FIG. 11, a fifth preferred embodiment 180 of the present invention is illustrated. A signal wire 186 requiring electromagnetic protection is illustrated. To enhance the ability of the conductive loaded resin-based shrinkable sleeve 184 to shunt electromagnetic energy to ground, a grounding wire 188 is applied between the signal 186 and the sleeve 184. More preferably, the grounding wire 188 is radially wrapped around the signal wire 186 prior to installation of the sleeve 184. Once the sleeve 184 is shrunk, the grounding wire 188 can easily be attached to a ground.

Referring again to FIG. 1a, the pre-stretched conductive loaded resin-based sleeve 14 is fitted over the signal wires 16a and 16b. Note that, in this embodiment, the signal wires 16a and 16b preferably bear an insulating outer layer over a core conductor. In this way, the conductive loaded resin-based sleeve 14 does not directly contact the core wire. In other embodiments, the protected device, wire, or object may be non-insulated. Referring now to FIG. 1b, a heating source, such as a heated air blower, is used to transfer heat into the tube 14. When the tube 14 reaches a sufficient temperature to allow intra-chain movement within the base resin polymer, then the stretching stress is released and the tube recovers to its original, pre-stretching dimensions. In this case, the tube contracts to form a tight sleeve around the wires 16a and 16b.

Figure 12:
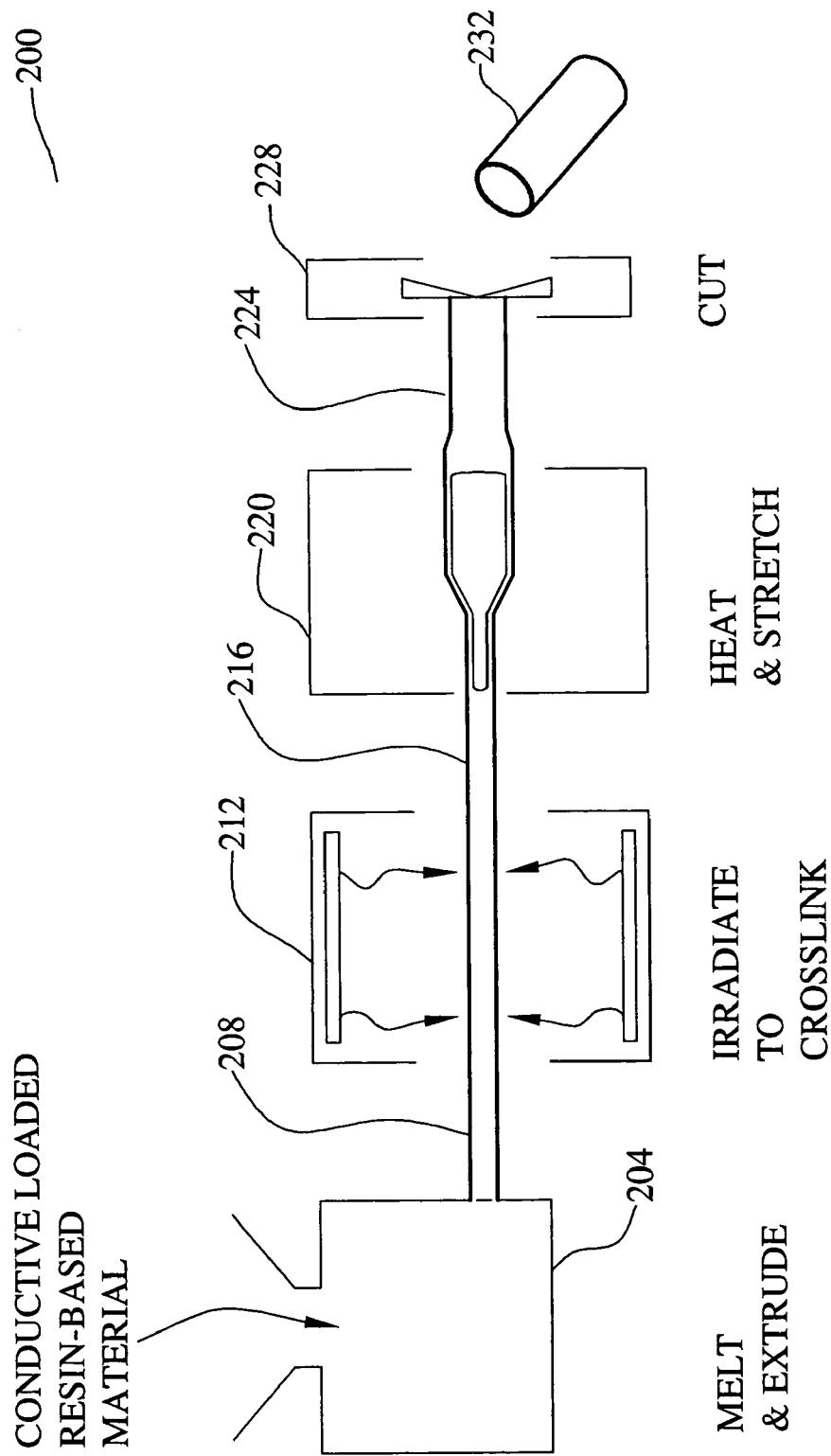
FIG. 12 illustrates a sixth preferred embodiment of the present invention showing, in simplified schematic representation, a manufacturing method for forming the conductive loaded resin-based shrinkable tubing.

Referring now to FIG. 12, a sixth preferred embodiment of the present invention is illustrated. A simplified schematic representation 200 of a manufacturing method for forming the conductive loaded resin-based shrinkable tubing is shown. The conductive loaded resin-based material, as described herein, is loaded into a molding apparatus 204. In this case, the molding apparatus 204 comprises an extrusion machine particularly constructed for the extrusion molding of continuous sleeves or tubing 208. Alternatively, sheeting or other shapes may be formed by the extrusion apparatus 204. According to another embodiment, an injection molding machine, or other molding apparatus, is used to form any or a variety of shapes. As part of the molding process, the conductive loaded resin-based material, preferably in a capsulated form, is loaded into the apparatus 204 and then heated until melted. During the heating process, the conductive loaded resin-based capsules release the molten base resin and the fiber and/or powder content to form a homogeneous mixture prior to extrusion.

The extruded tubing 208 is next irradiated 212 to cause cross-linking of polymer chains. The irradiation process may comprise, for example, exposure to high energy electrons, high energy ions. Alternatively, the conductive loaded resin-based material may be exposed to a chemical catalyst, such as organic peroxide, to stimulate cross-linking. This cross-linking adds substantial plasticity to the resulting tubular molding 216. The tubular or sleeve molding 216 is next subjected to a stretching process 220. During the stretching process 220, the sleeve 216 is heated to a temperature that is sufficient to allow the material to exhibit substantial plastic stretching and yet a temperature that is below the actual melting point of the material. If the sleeve 216 has a circular cross section, then the cross sectional diameter is mechanically stretched to substantially increase this diameter. For example, the ratio of the starting diameter of the pre-stretched sleeve 216 to that of the post-stretched sleeve 224 is preferably between about 1:2 and about 1:4. Finally, the cross-linked and stretched tube 224 is sectioned into usable pieces 232 by a cutting apparatus 228. When these tubes or sleeves 232 are later applied to a wire or other object and then heated, the conductive loaded resin-based material 232 recovers and returns to approximately the original molded diameter. Therefore, a diameter reduction of between about 2:1 and about 4:1 is exhibited during the heat shrinking process.

Figure 7:
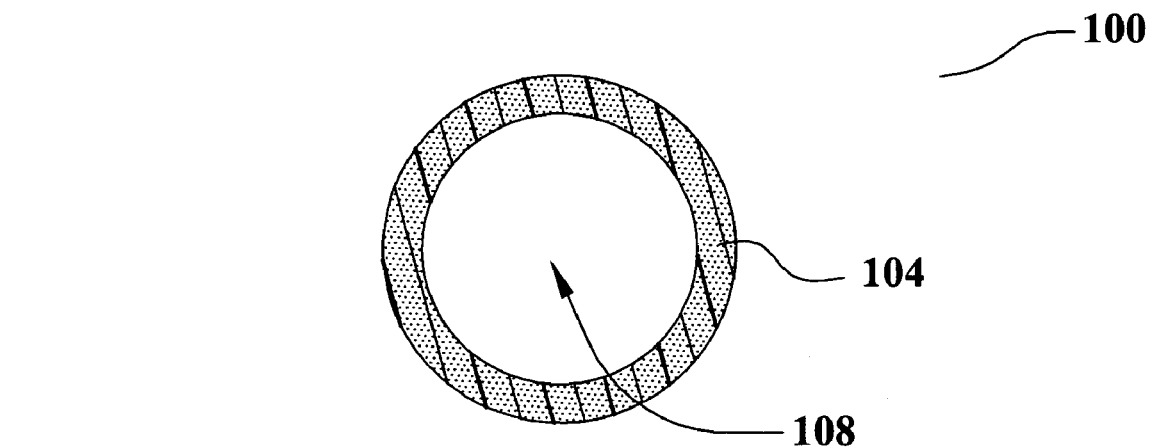
FIG. 7 illustrates the first preferred embodiment of the present invention wherein the shrinkable tubing is a single layer of the conductive loaded resin-based material.

Referring now to FIG. 7, the first preferred embodiment 100 of the present invention is again illustrated. The sleeve or tube 104 is shown in cross sectional representation. The tube 104 is formed of the conductive loaded resin-based material of the present invention. An opening, or void 108, is formed for the device, wiring, or other object that will be protected by the sleeve 104. In this embodiment, the conductive loaded resin-based material 104 must exhibit the heat shrinking property.

Figure 8:
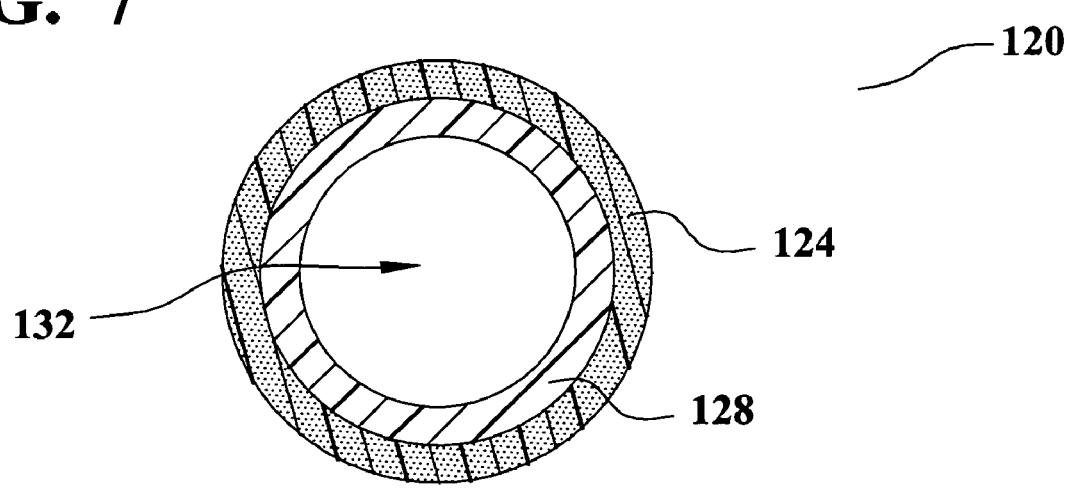
FIG. 8 illustrates a second preferred embodiment of the present invention wherein the shrinkable tubing comprises a conductive loaded resin-based layer surrounding an insulating layer.

Referring now to FIG. 8, a second preferred embodiment 100 of the present invention is illustrated. In this embodiment, the conductive loaded resin-based material 124 is formed surrounding an insulating layer 128. This configuration 120 provides an insulating barrier between the protected device, wiring, or other object placed into the void 132 and the conductive loaded resin-based material of the sleeve 124. In a preferred embodiment, the insulating layer 128 comprises a resin-based material. This resin-based material 128 is extruded to form an inner sleeve 128. The conductive loaded resin-based material 124 is then co-extruded onto the inner sleeve 128 to form the shrinkable sleeve 120 having an inner void area 132. In this embodiment, both the conductive loaded resin-based material outer sleeve 124 and the resin-based inner sleeve 128 are cross-linked and pre-stretched. Therefore, when the heat treatment is applied, both the outer and inner sleeves 124 and 128 recover, or shrink, in diameter. More preferably, the inner and outer sleeves 128 and 124 each comprise the same base resin material to facilitate the best layer-to-layer bonding. In another embodiment, only the outer conductive loaded resin-based material layer 124 is cross-linked. In this case, during shrink heating, the outer layer contracts, or shrinks, while the inner layer merely flows to conform to the topology of the encased device, wire, or other object.

Figure 9:
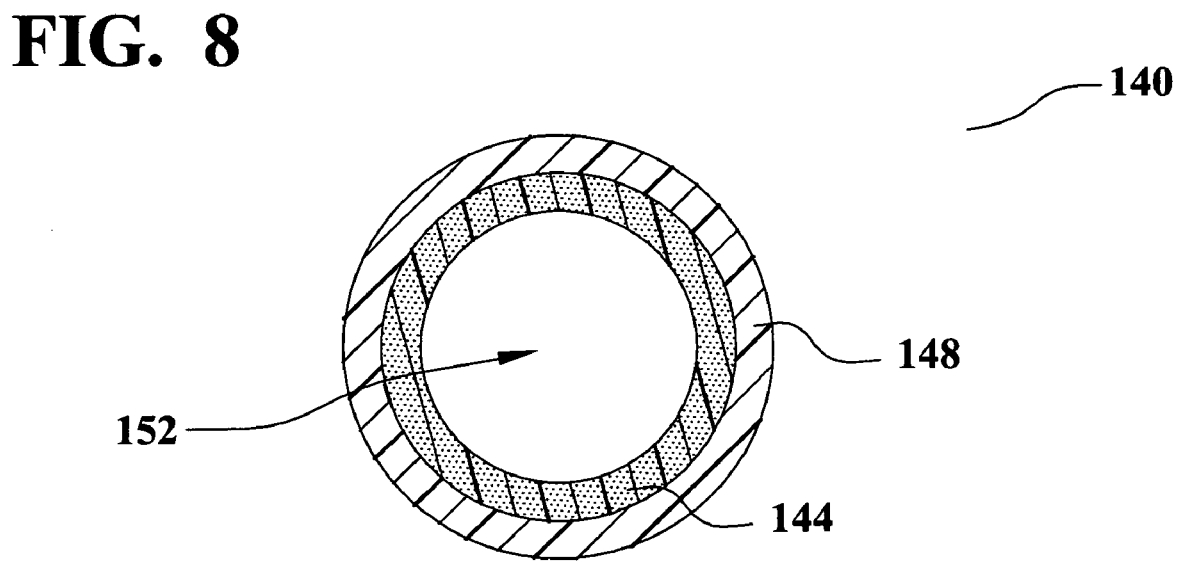
FIG. 9 illustrates a third preferred embodiment of the present invention wherein the shrinkable tubing comprises an insulating layer surrounding a conductive loaded resin-based layer.

Referring now to FIG. 9, a third preferred embodiment 140 of the present invention is illustrated. In this embodiment 140, the inner sleeve 144 comprises the conductive loaded resin-based material while the outer sleeve 148 comprises the insulating layer. This embodiment 140 is particularly useful if the protected device, wiring, or other object in the void area 152 is self-insulated and does not require a barrier between the this object and the conductive loaded resin-based material. In a preferred embodiment, the conductive loaded resin-based material is first extruded to form an inner sleeve 144. The insulating layer 148 is then co-extruded onto the inner sleeve 144 to form the shrinkable sleeve 140 having an inner void area 152. In this embodiment, both the conductive loaded resin-based material inner sleeve 144 and the resin-based outer sleeve 148 are cross-linked and pre-stretched. Therefore, when the heat treatment is applied, both the outer and inner sleeves 148 and 144 recover, or shrink, in diameter. More preferably, the inner and outer sleeves 144 and 148 each comprise the same base resin material to facilitate the best layer-to-layer bonding. In another embodiment, only the outer resin-based insulating layer 148 is cross-linked. In this case, during shrink heating, the outer layer 148 contracts, or shrinks, while the inner layer 144 merely flows to conform to the topology of the encased device, wire, or other object.

Figure 10:
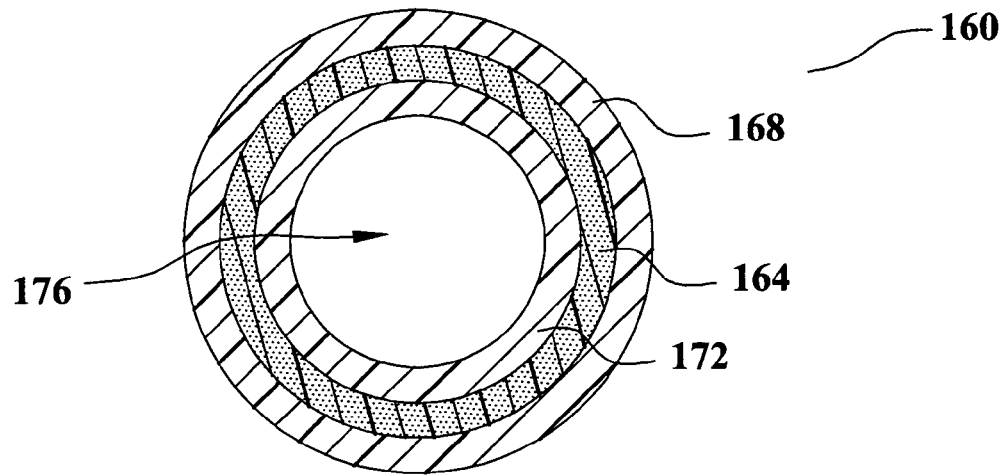
FIG. 10 illustrates a fourth preferred embodiment of the present invention wherein the shrinkable tubing comprises a conductive loaded resin-based layer sandwiched between inner and outer insulating layers.

Referring now to FIG. 10, a fourth preferred embodiment 160 of the present invention is illustrated. In this embodiment 160, the conductive loaded resin-based material sleeve 164 is sandwiched between an inner sleeve 172 comprising an insulating layer and an outer sleeve 168 comprising an insulating layer. This embodiment 160 is particularly useful where the protected device, wiring, or other object in the void area 176 does require a barrier between the this object and the conductive loaded resin-based material 164 and where the conductive loaded resin-based material 172 must be further insulated from the outside. In a preferred embodiment, an insulating layer 172 is first extruded to form an inner sleeve 172. The conductive loaded resin-based material 164 is then co-extruded onto the inner sleeve 172. Finally, another insulating layer 168 is co-extruded onto the conductive loaded resin-based material sleeve 164 to complete the shrinkable sleeve 160 having an inner void area 176. In this embodiment 160, the conductive loaded resin-based material sleeve 164 and resin-based inner and outer sleeves 172 and 168 are preferably cross-linked and pre-stretched. Therefore, when the heat treatment is applied, all of the sleeves layers 172, 164, and 168 recover, or shrink, in diameter. More preferably, the inner and outer sleeves 172 and 168 each comprise the same base resin material as the conductive loaded resin-based material 164 to facilitate the best layer-to-layer bonding. In another embodiment, only the outer resin-based insulating layer 168 is cross-linked. In this case, during shrink heating, the outer layer 168 contracts, or shrinks, while the conductive loaded resin-based material sleeve 164 and the inner sleeve 172 merely flow to conform to the topology of the encased device, wire, or other object.

Referring now to FIG. 11, a fifth preferred embodiment 180 of the present invention is illustrated. In this case, a patterned metal layer 188 is formed onto the conductive loaded resin-based material sleeve or tubing 184. The metal layer 188 is preferably formed by plating or by coating. If the method of formation is metal plating, then the resin-based structural material of the conductive loaded, resin-based material is one that can be metal plated. There are many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer 188 may be formed by, for example, electroplating or physical vapor deposition.

In this embodiment 180, the metal layer 188 is most preferably formed into a pattern that will accommodate the shrinkage of the conductive loaded resin-based material sleeve 184 as shown. For example, the metal layer 188 may be formed onto the conductive loaded resin-based material sleeve 184 after the sleeve has been stretched or expanded. Further, features in the metal layer 188 are defined such that, when the conductive loaded resin-based material 184 contracts under heating, the metal layer 188 will have adequate spaces to accommodate the surface area change.

Figure 13A:
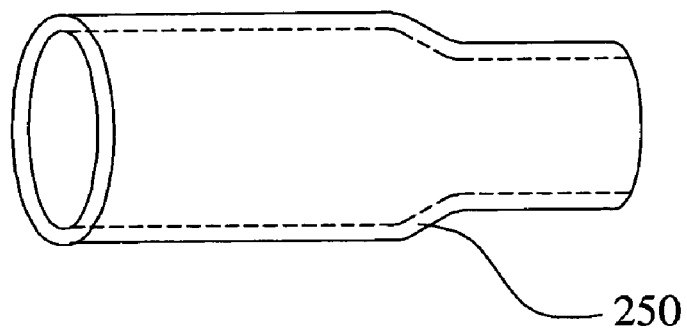
FIGS. 13a through 13d and 14a and 14b illustrate several additional embodiments of the present invention showing various shapes of shrinkable sleeves including boots, 'T" style sleeves, rectangular connector boots, and sheeting or wrapping material.
Figure 13B:
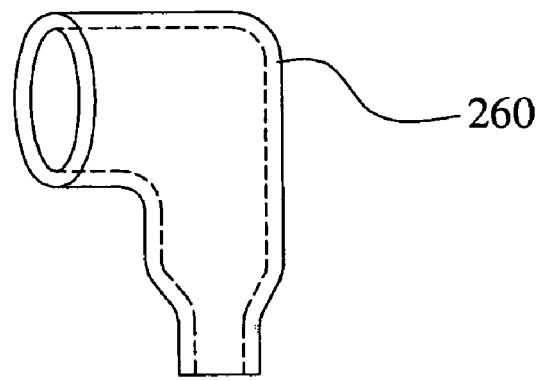
Figure 13C:
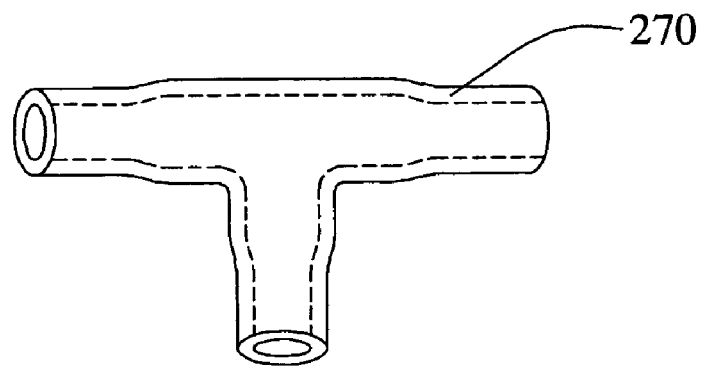
Figure 13D:
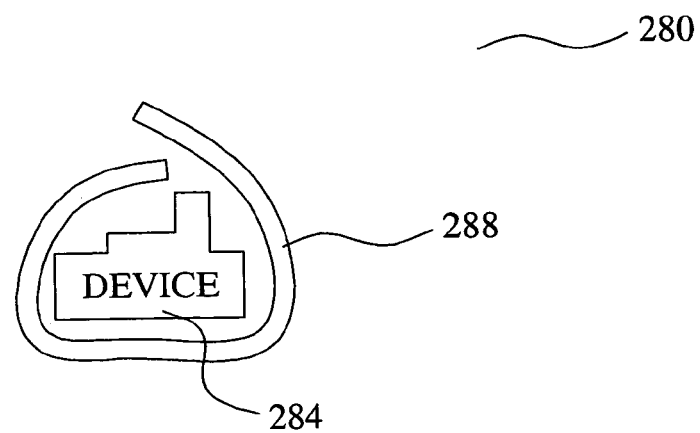
Figures 14A, 14B:
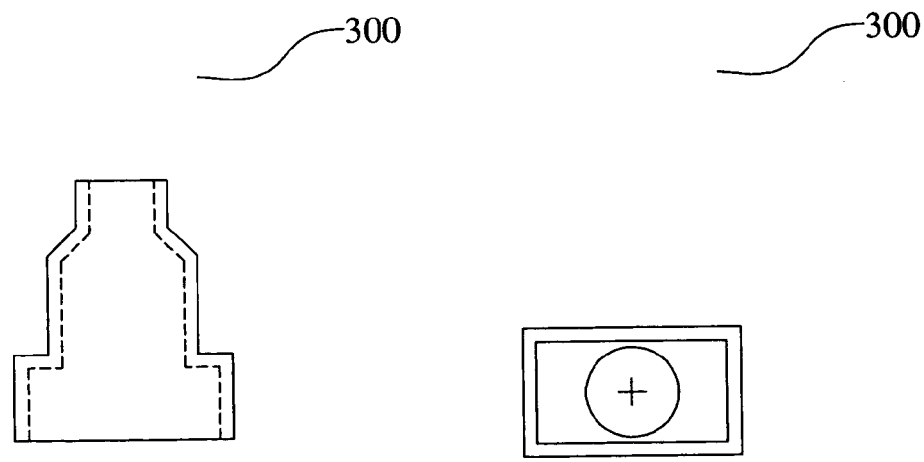

Referring now to FIGS. 13a through 13d and 14a and 14b, several additional preferred embodiments of the present invention are illustrated. In particular, FIG. 13a shows the electromagnetic energy absorbing shrinkable tube formed as a connector boot 250. In FIG. 13b, the connector boot 260 is in an 'L' configuration. Referring now to FIG. 13c, a 'T' branch sleeve 270 is shown. Alternatively, a 'Y' branch may be similarly formed. Referring now to FIG. 13d, the electromagnetic energy absorbing, shrinkable tube or sleeve concept is further extended to forming a sheet structure 288. This sheet 288 comprises the same conductive loaded resin-based material properties, as described above, and is formed using a mold/cross-link/pre-stretch sequence as previously described. The sheet 288 may be wrapped around a device 284 and is particularly useful for large or complexly shaped devices 284. An adhesive, or taping, not shown, may be used to join the ends of the sheeting 288 prior to heat shrinking. Referring now to FIGS. 14a and 14b, a boot 300 for a rectangular ended connector is shown in top view and in end view.

Figure 2:
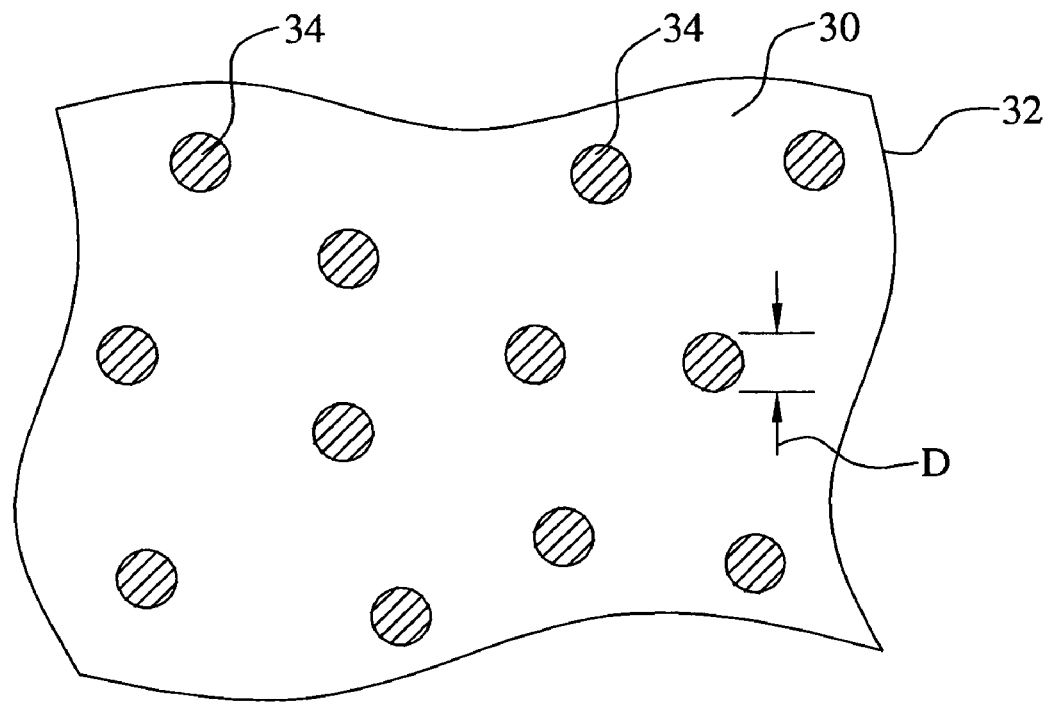
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
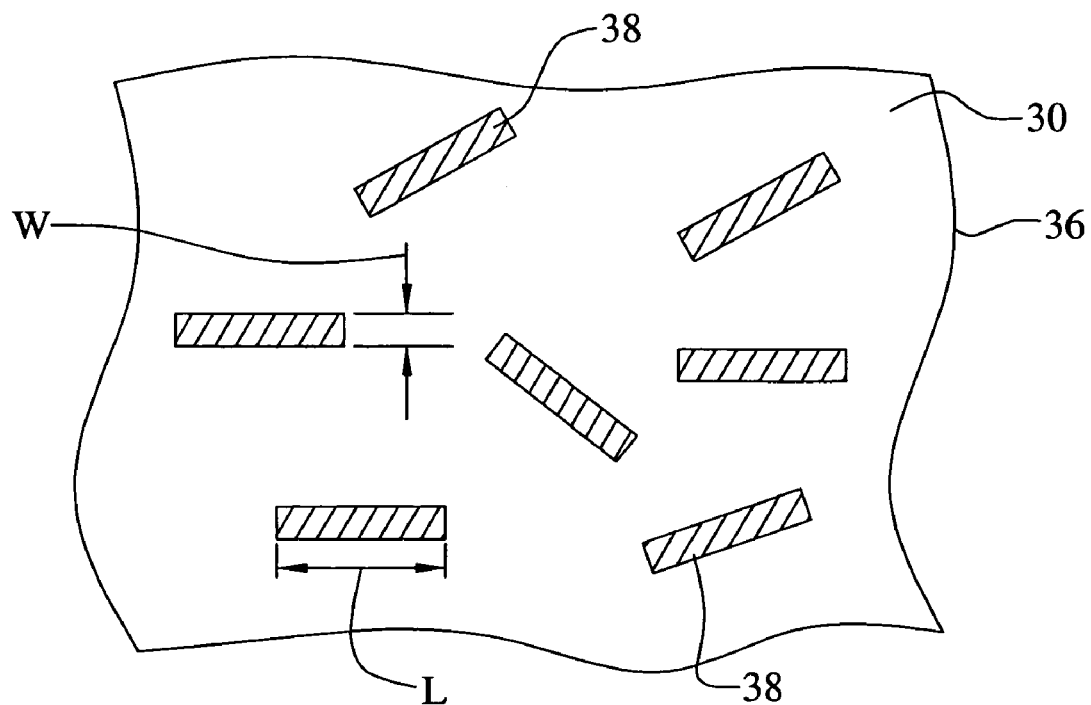
FIG. 3 illustrates a second preferred embodiment of a conductive loaded resin-based material wherein the conductive materials comprise micron conductive fibers.
Figure 4:
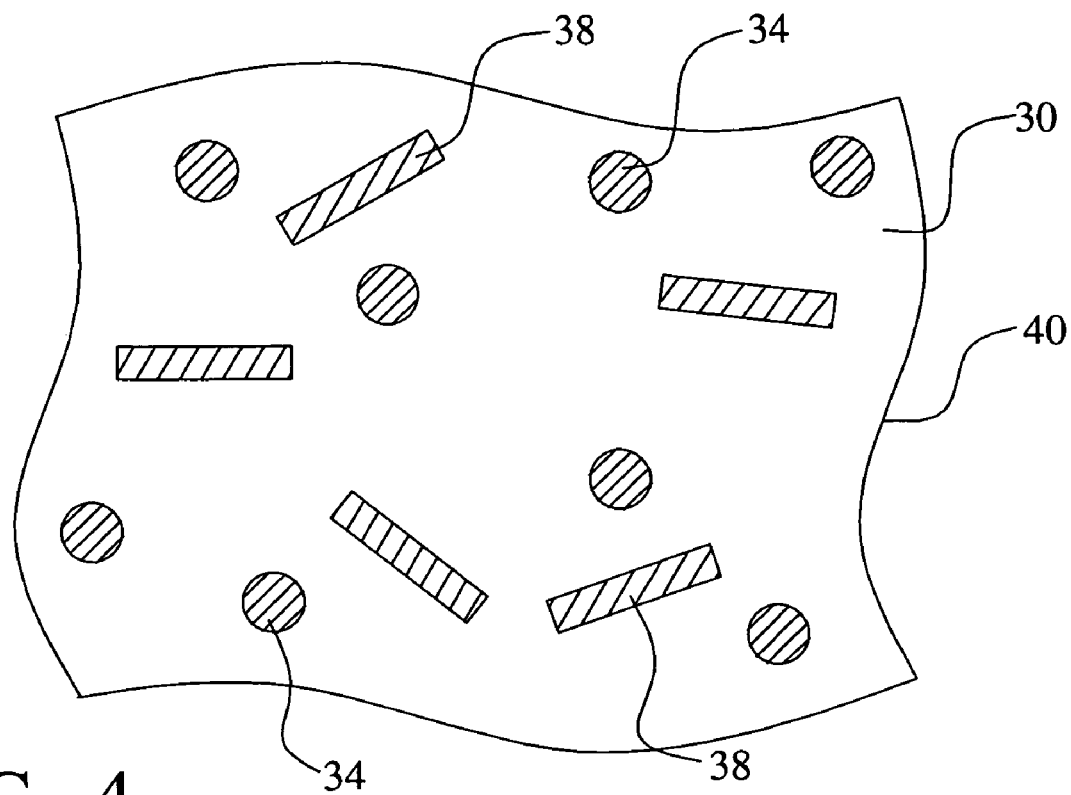
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a sheet resistance between about 5 and 25 ohms per square, though other values can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 8–11 micron in diameter and lengths of 4–6 mm and comprising, by weight, about 30% of the total weight of the conductive loaded resin-based material will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
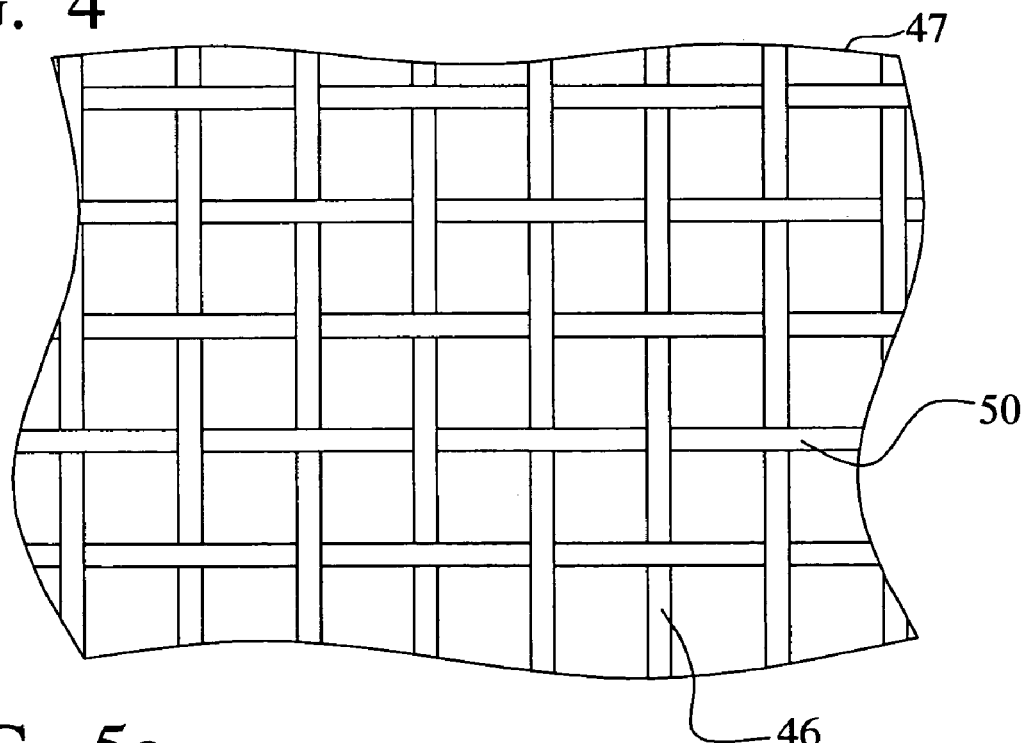

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Electromagnetic energy absorbing, shrinkable tubing formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the shrinkable tubing is removed.

FIG. 6b shows a simplified schematic diagram of an extruder 70 for forming the shrinkable tubing using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. An effective electromagnetic energy absorbing, shrinkable tubing is achieved. A method to form an electromagnetic energy absorbing, shrinkable tubing is also achieved. The visual, mechanical, or electrical characteristics of the electromagnetic energy absorbing, shrinkable tubing molded of conductive loaded resin-based material can be altered by forming a metal layer over the conductive loaded resin-based material. Methods to fabricate an electromagnetic energy absorbing, shrinkable tubing from a conductive loaded resin-based material incorporating various forms of the material are realized. The electromagnetic energy absorbing, shrinkable tubing may be fabricated from the conductive loaded resin-based material where the material is in the form of a fabric. In one embodiment, the electromagnetic energy absorbing, shrinkable tubing comprises a homogeneous material and that can be applied as a single sleeve. The electromagnetic energy absorbing, shrinkable tubing is lower in weight than prior art metal mesh sleeve and shrink tubing solutions. The electromagnetic energy absorbing, shrinkable tubing is compatible with a variety of base resins and of conductive loading materials. In one embodiment, electromagnetic energy absorbing, shrinkable tubing comprises conductive loaded resin-based material that is shrinkable. In another embodiment, the electromagnetic energy absorbing, shrinkable tubing comprises conductive loaded resin-based material is only flowable. The electromagnetic energy absorbing, shrinkable tubing is capable of formation in a variety of shapes, including sheeting.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A shrinkable electromagnetic energy absorbing device comprising:
   a hollow sleeve of a conductive loaded, resin-based material comprising conductive materials in a base resin host wherein said hollow sleeve independently shrinks when exposed to heat, wherein said conductive materials comprise micron conductive fiber, wherein the percent by weight of said conductive materials is between about 20% and about 50% of the total weight of said conductive loaded resin-based material, and wherein said conductive loaded resin-based material is cross-linked and stretched; and an insulating layer covering the outer surface of said conductive loaded, resin-based sleeve.

2. The device according to claim 1 wherein the percent by weight of said conductive materials is between about 20% and about 40% of the total weight of said conductive loaded resin-based material.

3. The device according to claim 1 wherein the percent by weight of said conductive materials is between about 25% and about 35% of the total weight of said conductive loaded resin-based material.

4. The device according to claim 1 wherein said conductive materials further comprise metal powder.

5. The device according to claim 4 wherein said metal powder is nickel, copper, or silver.

6. The device according to claim 4 wherein said metal powder is a non-conductive material with a metal plating.

7. The device according to claim 6 wherein said metal plating is nickel, copper, silver, or alloys thereof.

8. The device according to claim 4 wherein said metal powder comprises a diameter of between about 3 μm and about 12 μm.

9. The device according to claim 1 wherein said conductive materials further comprise non-metal powder.

10. The device according to claim 9 wherein said non-metal powder is carbon, graphite, or an amine-based material.

11. The device according to claim 1 wherein said conductive materials further comprise a combination of metal powder and non-metal powder.

12. The device according to claim 1 wherein said micron conductive fiber is stainless steel fiber or copper fiber, or silver fiber or combinations thereof.

13. The device according to claim 1 wherein said micron conductive fiber has a diameter of between about 3 μm and about 12 μm and a length of between about 2 mm and about 14 mm.

14. The device according to claim 1 wherein the percent by weight of said micron conductive fiber is between about 20% and about 40% of the total weight of said conductive loaded resin-based material.

15. The device according to claim 1 wherein said micron conductive fiber is stainless steel and wherein the percent by weight of said stainless steel fiber is between about 20% and about 40% of the total weight of said conductive loaded resin-based material.

16. The device according to claim 15 wherein said stainless steel fiber has a diameter of between about 3 μm and about 12 μm and a length of between about 2 mm and about 14 mm.

17. The device according to claim 1 wherein said conductive fiber is stainless steel.

18. The device according to claim 1 wherein said base resin and said conductive materials comprise flame-retardant materials.

19. The device according to claim 1 further comprising a conductive wire inserted into said hollow device.

20. The device according to claim 1 wherein said insulating layer comprises resin-based material.

21. The device according to claim 1 further comprising a second insulating layer lining said conductive loaded, resin-based sleeve.

22. The device according to claim 21 wherein said second insulating layer comprises a resin-based material.

23. The device according to claim 21 wherein said second insulating layer is cross-linked and stretched.

24. The device according to claim 1 wherein said sleeve is a wrapping sheet of said conductive loaded resin-based material.

25. A shrinkable electromagnetic energy absorbing device comprising:

a hollow sleeve of a conductive loaded, resin-based material comprising conductive materials in a base resin host wherein said hollow sleeve independently shrinks when exposed to heat, wherein said conductive materials comprise micron conductive fiber, wherein the percent by weight of said conductive materials is between about 20% and about 50% of the total weight of said conductive loaded resin-based material, and wherein said conductive loaded resin-based material is cross-linked and stretched1 a first insulating layer lining said conductive loaded, resin-based sleeve; and a second insulating layer surrounding the outer surface of said conductive loaded resin-based sleeve wherein said first and second insulating layers comprise resin-based material.

26. The device according to claim 25 wherein the percent by weight of said conductive materials is between about 20% and about 40% of the total weight of said conductive loaded resin-based material.

27. The device according to claim 25 wherein the percent by weight of said conductive materials is between about 25% and about 35% of the total weight of said conductive loaded resin-based material.

28. The device according to claim 25 wherein said conductive materials further comprise metal powder.

29. The device according to claim 28 wherein said metal powder is a non-conductive material with a metal plating.

30. The device according to claim 28 wherein said metal powder comprises a diameter of between about 3 μm and about 12 μm.

31. The device according to claim 25 wherein said conductive materials further comprise non-metal powder.

32. The device according to claim 25 wherein said conductive materials further comprise a combination of metal powder and non-metal powder.

33. The device according to claim 25 wherein said micron conductive fiber has a diameter of between about 3 μm and about 12 μm and a length of between about 2 mm and about 14 mm.

34. The device according to claim 25 wherein the percent by weight of said micron conductive fiber is between about 20% and about 40% of the total weight of said conductive loaded resin-based material.

35. The device according to claim 25 wherein said micron conductive fiber is stainless steel and wherein the percent by weight of said stainless steel fiber is between about 20% and about 40% of the total weight of said conductive loaded resin-based material.

36. The device according to claim 35 wherein said stainless steel fiber has a diameter of between about 3 μm and about 12 μm and a length of between about 2 mm and about 14 mm.

37. The device according to claim 25 wherein said conductive materials comprise a combination of conductive powder and conductive fiber.

38. The device according to claim 25 wherein said insulating layers are cross-linked and stretched.

39. The device according to claim 25 wherein said sleeve is a wrapping sheet of said conductive loaded resin-based material.

40. A method to form shrinkable electromagnetic energy absorbing device, said method comprising:
- providing a conductive loaded, resin-based material comprising conductive materials in a resin-based host and wherein said conductive materials comprise micron conductive fiber and wherein the percent by weight of said conductive materials is between about 20% and about 40% of the total weight of said conductive loaded resin-based material; and
- molding said conductive loaded, resin-based material into a shrinkable electromagnetic energy absorbing device;
- cross-linking polymer chains in said electromagnetic energy absorbing device such that said device will independently shrink when expos&d to heat;
- stretching said electromagnetic energy absorbing device; and
- forming an insulating layer on said conductive loaded, resin-based device to cover the outer surface of said conductive loaded resin-based material.

41. The method according to claim 40 wherein the percent by weight of said conductive materials is between about 20% and about 40% of the total weight of said conductive loaded resin-based material.

42. The method according to claim 40 wherein said micron conductive fiber is stainless steel fiber, or copper fiber, or silver fiber or combinations thereof.

43. The method according to claim 40 wherein said micron conductive fiber has a diameter of between about 3 µm and about 12 µm and a length of between about 2 mm and about 14 mm.

44. The method according to claim 40 wherein the percent by weight of said micron conductive fiber is between about 20% and about 40% of the total weight of said conductive loaded resin-based material.

45. The method according to claim 40 wherein said micron conductive fiber is stainless steel and wherein the percent by weight of said stainless steel fiber is between about 20% and about 40% of the total weight of said conductive loaded resin-based material.

46. The method according to claim 45 wherein said stainless steel fiber has a diameter of between about 3 µm and about 12 µm and a length of between about 2 mm and about 14 mm.

47. The method according to claim 40 wherein said conductive materials further comprise conductive powder.

48. The method according to claim 40 wherein said molding comprises:
- injecting said conductive loaded, resin-based material into a mold;
- curing said conductive loaded, resin-based material; and
- removing said shrinkable electromagnetic energy absorbing device from said mold.

49. The method according to claim 40 wherein said molding comprises:
- loading said conductive loaded, resin-based material into a chamber;
- extruding said conductive loaded, resin-based material out of said chamber through a shaping outlet; and
- curing said conductive loaded, resin-based material to form said shrinkable electromagnetic energy absorbing device.

50. The method according to claim 40 further comprising subsequent mechanical processing of said molded conductive loaded, resin-based material.

51. The method according to claim 40, wherein said cross-linking comprises irradiation by an electron or an ion source.

52. The method according to claim 40, wherein said cross-linking comprises chemical reaction.

53. The method according to claim 40, wherein said stretching comprises heating said conductive loaded resin based material.

54. The method according to claim 40 wherein said electromagnetic energy absorbing device is a sleeve and wherein said insulating layer lines said sleeve.

55. The method according to claim 54 wherein said insulating layer comprises a resin-based material.

56. The method according to claim 54 further comprising:
- cross-linking polymer chains in said insulating layer; and
- a stretching said insulating layer.

\* \* \* \* \*